US010445460B2

(12) United States Patent
Teramae et al.

(10) Patent No.: US 10,445,460 B2
(45) Date of Patent: Oct. 15, 2019

(54) VIA MODEL GENERATION METHOD, INFORMATION PROCESSING DEVICE, AND NON-TRANSITORY COMPUTER-READABLE RECORDING MEDIUM STORING VIA MODEL GENERATION PROGRAM

(71) Applicant: FUJITSU LIMITED, Kawasaki-shi, Kanagawa (JP)

(72) Inventors: Kumiko Teramae, Setagaya (JP); Hikoyuki Kawata, Kawasaki (JP); Takashi Fukuda, Machida (JP); Megumi Tanaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 114 days.

(21) Appl. No.: 15/817,695

(22) Filed: Nov. 20, 2017

(65) Prior Publication Data
US 2018/0150593 A1 May 31, 2018

(30) Foreign Application Priority Data

Nov. 28, 2016 (JP) .................................. 2016-230121

(51) Int. Cl.
*G06F 17/50* (2006.01)
*H05K 3/00* (2006.01)
*H05K 1/02* (2006.01)
*H05K 1/11* (2006.01)

(52) U.S. Cl.
CPC ...... *G06F 17/5081* (2013.01); *G06F 17/5036* (2013.01); *H05K 3/0005* (2013.01); *H05K 1/0251* (2013.01); *H05K 1/115* (2013.01)

(58) Field of Classification Search
CPC .................. G06F 17/5081; H05K 3/0005

USPC ................................................. 716/106, 136
See application file for complete search history.

(56) References Cited

U.S. PATENT DOCUMENTS

| | | | | |
|---|---|---|---|---|
| 6,976,233 B1* | 12/2005 | Frank et al. | ........ | G06F 17/5018 716/112 |
| 8,453,102 B1* | 5/2013 | Pack et al. | ............ | G06F 17/505 716/139 |
| 8,560,296 B2* | 10/2013 | Norte | ................... | H05K 1/0251 703/14 |

(Continued)

FOREIGN PATENT DOCUMENTS

| | | |
|---|---|---|
| JP | 2006-011753 | 1/2006 |
| JP | 2007-258358 | 10/2007 |

*Primary Examiner* — Sun J Lin
(74) *Attorney, Agent, or Firm* — Fujitsu Patent Center

(57) ABSTRACT

A via model generation method includes: acquiring via arrangement information including a hole diameter of a via formed in a board including a plurality of wiring layers, a clearance distance between a ground conductor formed in one wiring layer of the plurality of wiring layers and the via, and a ground via distance between the via and a ground via coupled to the ground conductor; acquiring board information including a relative dielectric constant of the board; calculating a capacitance component of the via by a first electromagnetic field analysis using the hole diameter of the via, the clearance distance, and the relative dielectric constant of the board; calculating an inductance component of the via by a second electromagnetic field analysis using the hole diameter of the via, the ground via distance, and the relative dielectric constant of the board; and generating a via model including the capacitance and inductance components.

20 Claims, 15 Drawing Sheets

(56) References Cited

U.S. PATENT DOCUMENTS

| | | | | |
|---|---|---|---|---|
| 8,806,421 | B1 * | 8/2014 | Wei et al. | G06F 17/5081 |
| | | | | 716/137 |
| 8,853,848 | B2 * | 10/2014 | Wu | H05K 1/0222 |
| | | | | 257/690 |
| 2001/0003380 | A1 * | 6/2001 | Albinsson | H01L 23/5222 |
| | | | | 257/778 |
| 2006/0036423 | A1 * | 2/2006 | Fujimori | G06F 17/504 |
| | | | | 703/14 |
| 2006/0258187 | A1 * | 11/2006 | Behziz | H05K 1/0251 |
| | | | | 439/77 |
| 2007/0040735 | A1 * | 2/2007 | Matsuo et al. | H01L 23/552 |
| | | | | 342/175 |
| 2007/0091581 | A1 * | 4/2007 | Gisin et al. | H05K 1/023 |
| | | | | 361/782 |
| 2007/0130555 | A1 * | 6/2007 | Osaka | H01L 23/49838 |
| | | | | 439/14 |
| 2010/0138800 | A1 * | 6/2010 | Kobayashi | G06F 17/5068 |
| | | | | 716/115 |
| 2011/0006862 | A1 * | 1/2011 | Yasooka | H01L 23/055 |
| | | | | 333/230 |
| 2012/0215515 | A1 * | 8/2012 | Norte | H05K 1/0251 |
| | | | | 703/14 |
| 2014/0208286 | A1 * | 7/2014 | Wei et al. | G06F 17/5068 |
| | | | | 716/135 |

\* cited by examiner

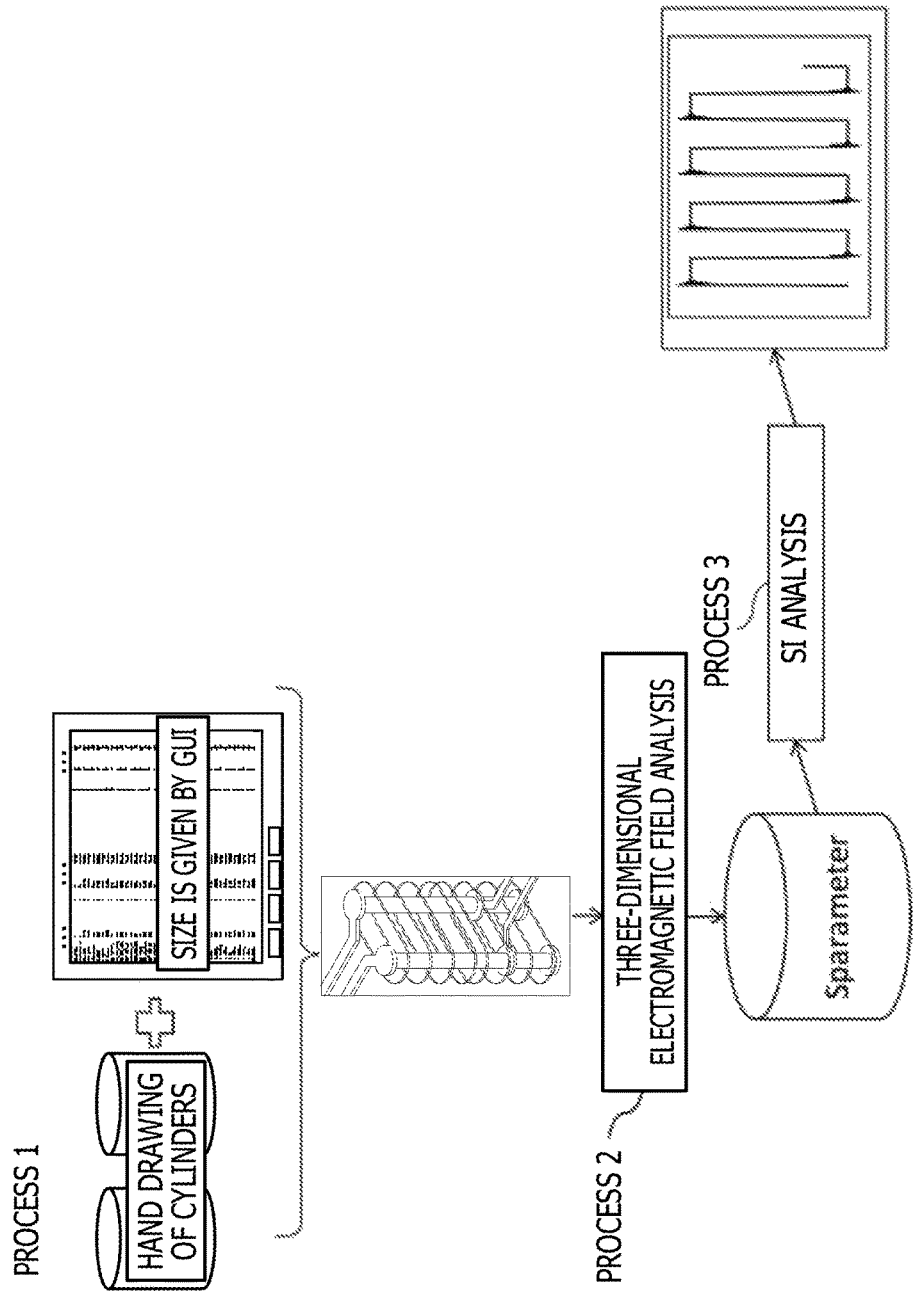

FIG. 3

| | 3D ELECTROMAGNETIC FIELD ANALYSIS |
|---|---|
| ACCURACY | HIGH |
| TIME IT TAKES TO GENERATE VIA MODEL AIMED AT SI ANALYSIS | LONG (ONE DAY) |
| | S-PARAMETER GENERATION (3 TO 5 HOURS) |
| | THREE-DIMENSIONAL ELECTROMAGNETIC FIELD ANALYSIS (10 HOURS) |

FIG. 15

| | 3D ELECTROMAGNETIC FIELD ANALYSIS | 2.5D ELECTROMAGNETIC FIELD ANALYSIS (PRESENT EMBODIMENT) |
|---|---|---|
| ACCURACY | HIGH | HIGH (UP TO 10 Gbps) ACCURACY EQUIVALENT TO ACCURACY OF 3D |
| TIME IT TAKES TO GENERATE VIA MODEL AIMED AT SI ANALYSIS | LONG (ONE DAY) | SHORT (SEVERAL MINUTES) |
| | GENERATION OF THREE-DIMENSIONAL MODEL (3 TO 5 HOURS) | GENERATION OF 2.5-DIMENSIONAL MODEL (1 MINUTE) |
| | THREE-DIMENSIONAL ANALYSIS TIME (10 HOURS) | 2.5-DIMENSIONAL ANALYSIS TIME (5 MINUTES) |

VIA MODEL GENERATION METHOD, INFORMATION PROCESSING DEVICE, AND NON-TRANSITORY COMPUTER-READABLE RECORDING MEDIUM STORING VIA MODEL GENERATION PROGRAM

CROSS-REFERENCE TO RELATED APPLICATION

This application is based upon and claims the benefit of priority of the prior Japanese Patent Application No. 2016-230121, filed on Nov. 28, 2016, the entire contents of which are incorporated herein by reference.

FIELD

The embodiments discussed herein are related to a via model generation method.

BACKGROUND

Vias formed in a transmission line or a multilayer wiring board are modeled by using an electromagnetic field analysis.

A related art is disclosed in Japanese Laid-open Patent Publication No. 2007-258358 or Japanese Laid-open Patent Publication No. 2006-11753.

SUMMARY

According to an aspect of the embodiments, a via model generation method includes: acquiring via arrangement information including a hole diameter of a via formed in a board including a plurality of wiring layers, clearance distance between a ground conductor formed in one of the plurality of wiring layers and the via, and ground via distance between the via and a ground via coupled to the ground conductor; acquiring, by a computer, board information including a relative dielectric constant of the board; calculating a capacitance component of the via by a first electromagnetic field analysis with use of the hole diameter of the via, the clearance distance, and the relative dielectric constant of the board; calculating an inductance component of the via by a second electromagnetic field analysis with use of the hole diameter of the via, the ground via distance, and the relative dielectric constant of the board; and generating a via model including the capacitance component and the inductance component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 illustrates one example of processes of third modeling with use of a three-dimensional electromagnetic field analysis;

FIG. 3 illustrates one example of characteristics of third modeling with use of a three-dimensional electromagnetic field analysis;

FIG. 15 illustrates one example of comparison between characteristics of modeling with use of a three-dimensional electromagnetic field analysis and characteristics of modeling with use of a 2.5-dimensional electromagnetic field analysis.

DESCRIPTION OF EMBODIMENTS

For example, in order to match the characteristic impedance of a board, the distance between a through-hole that is formed in a transmission line that transmits a differential signal and is referred to as a via and a grounded through-hole and the hole diameter of the through-hole are designed as appropriate.

For example, a via formed in a multilayer wiring board is modeled by extracting a capacitance component and a reactance component regarding each layer by using the land diameter and the clearance diameter of the via.

Along with increase in the communication speed of the transmission line that transmits a signal on a printed board, improvement in the accuracy of a transmission line model used for a transmission line analysis such as a signal integrity (SI) analysis of a transmission line is desired. In order to improve the accuracy of the transmission line model, vias included in the transmission line are modeled by using a three-dimensional electromagnetic field analysis, for example.

For example, in the case of modeling vias by using the three-dimensional electromagnetic field analysis, it might take a long time to model the vias because the number of processes such as generating computer-aided design (CAD) data that represents arrangement information of the vias is large.

For example, a via model generation method with which vias are accurately modeled in a short time may be provided.

For example, when modeling a via by a 2.5-dimensional electromagnetic field analysis, a via model generation program calculates a capacitance component by using the clearance distance between the via and a ground conductor and calculates an inductance component by using the distance between the via and a ground via. For example, the via model generation program might model the via to generate a via model in a shorter time than modeling the via by a three-dimensional electromagnetic field analysis because modeling the via by the 2.5-dimensional electromagnetic field analysis. For example, the via model generation program uses the distance from the ground via for the calculation of the inductance component of the via and therefore the occurrence of a large calculation error of the inductance component due to the influence of the clearance might be reduced.

Figure 1A:
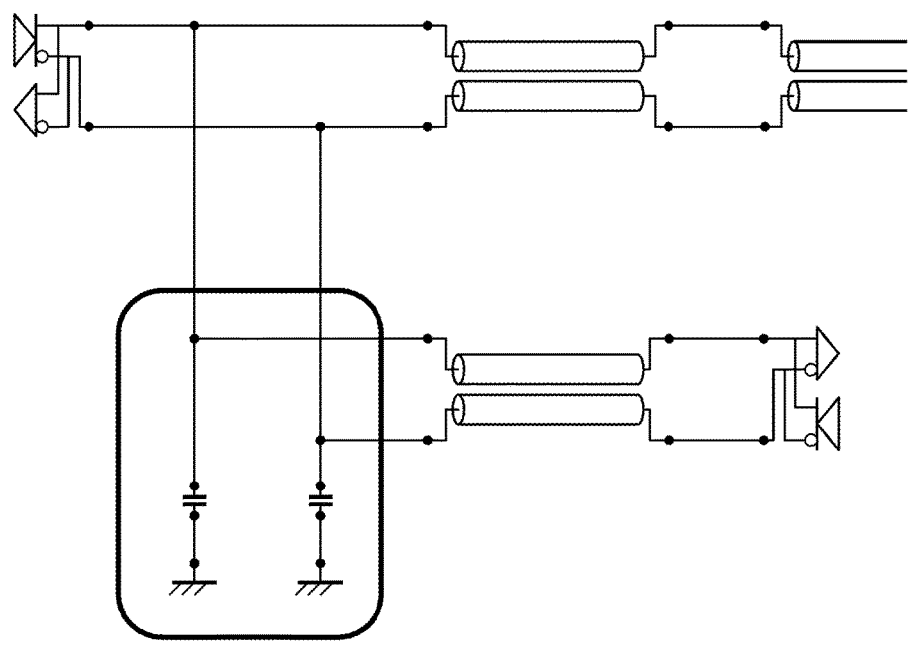
FIG. 1A illustrates one example of a first model of vias formed in a board in which a communication speed is low.
Figure 1B:
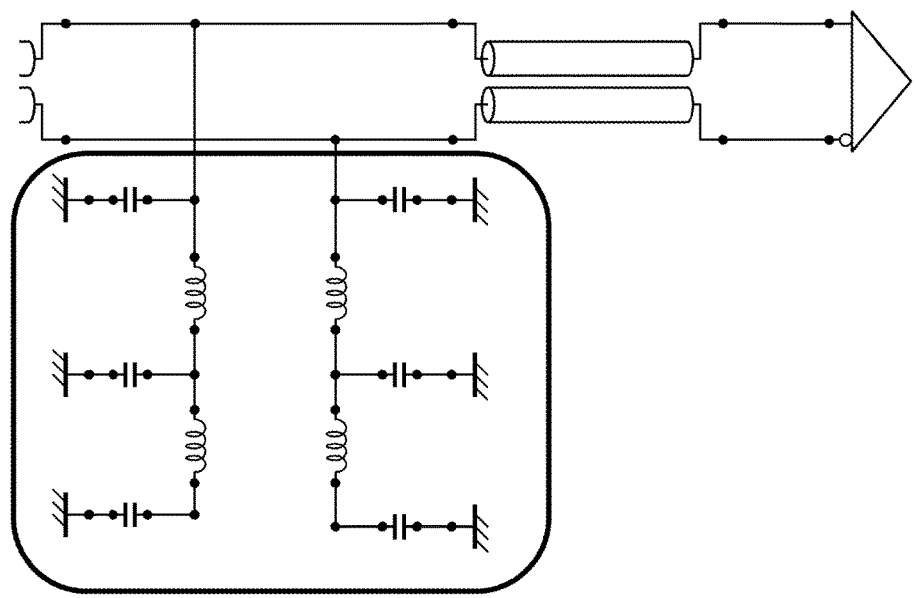
FIG. 1B illustrates one example of a second model of vias formed in a board in which a communication speed is low.

FIG. 1A illustrates one example of a first model of vias formed in a board in which a communication speed is low. FIG. 1B illustrates one example of a second model of vias formed in a board in which a communication speed is low.

In the first model illustrated in FIG. 1A, the vias are modeled as simple capacitance. In the second model illustrated in FIG. 1B, the vias are modeled as an LC (inductance-capacitance) equivalent circuit. One example of modeling vias as an LC equivalent circuit is described in "Method of Modeling differential Vias Issue: 2.1 Date: Jan. 25, 2011 Lambert Simonovich, Dr. Eric Bogatin, Dr. Yazi Cao," for example. The vias modeled by the first modeling and the second modeling are useful when the communication speed is equal to or lower than 1 Gbps. However, the analysis accuracy of an SI analysis becomes low when the communication speed surpasses 1 Gbps. In order to implement an SI analysis with high accuracy in e.g. the case in which the communication speed is 10 Gbps or the like, vias may be modeled by third modeling in which the S-parameter of the vias is extracted by a three-dimensional electromagnetic field analysis and the vias are modeled.

FIG. 2 illustrates one example of processes of the third modeling with use of a three-dimensional electromagnetic field analysis.

For example, an operator creates the schematic shape of vias, such as a cylindrical shape, and so forth by using a CAD tool or the like. In addition, the operator inputs via arrangement information such as the size of the vias, including the diameter of the vias, the interval between differential vias, the clearance shape, to the via schematic shape as parameters through a graphical user interface (GUI) (PROCESS 1). In response to an instruction by the operator, an information processing device carries out the three-dimensional electromagnetic field analysis of the vias created in PROCESS 1 by using a three-dimensional electromagnetic field analysis simulator such as HFSS made by ANSYS, Inc., for example, and extracts the S-parameter of the vias as via models (PROCESS 2). In response to an instruction by the operator, the information processing device carries out an SI analysis by using the S-parameter extracted in PROCESS 2 (PROCESS 3).

Due to the modeling of vias by the third modeling with use of the three-dimensional electromagnetic field analysis, the SI analysis with high accuracy is implemented. For example, if vias are modeled by the third modeling with use of the three-dimensional electromagnetic field analysis, the turnaround time of the SI analysis may be long.

FIG. 3 illustrates one example of characteristics of third modeling with use of a three-dimensional electromagnetic field analysis.

With the third modeling with use of the three-dimensional electromagnetic field analysis, the turnaround time of the SI analysis might be long although the SI analysis with high accuracy is carried out. For example, the turnaround time of the SI analysis might be approximately one day because it takes three to five hours to carry out the generation of the S-parameter represented in PROCESS 1 in FIG. 2 and it takes approximately ten hours to carry out the three-dimensional electromagnetic field analysis represented in PROCESS 2 in FIG. 2.

In modeling of vias, for example, the vias may be modeled with high accuracy in a short time by using not the three-dimensional electromagnetic field analysis but a 2.5-dimensional electromagnetic field analysis. For example, the shape of the target of the electromagnetic field analysis is stereoscopically modeled in the three-dimensional electromagnetic field analysis and the shape of the target of the electromagnetic field analysis is planarly modeled in the 2.5-dimensional electromagnetic field analysis. In 2.5 dimensions, the shape and characteristics in one direction of the basis vectors that make three dimensions, e.g. the z-axis direction, are deemed to be uniform and a three-dimensional shape is treated as two dimensions, so that the actual characteristics of the analysis target object in the z-axis direction are simplified. In three dimensions, the characteristics of the analysis target object in the z-axis direction are faithfully simulated and thus the accuracy is higher than in 2.5 dimensions. However, the creation time of the electromagnetic field analysis model becomes longer and the amount of calculation of the electromagnetic field analysis also increases compared with 2.5 dimensions.

Figures 4A, 4B:
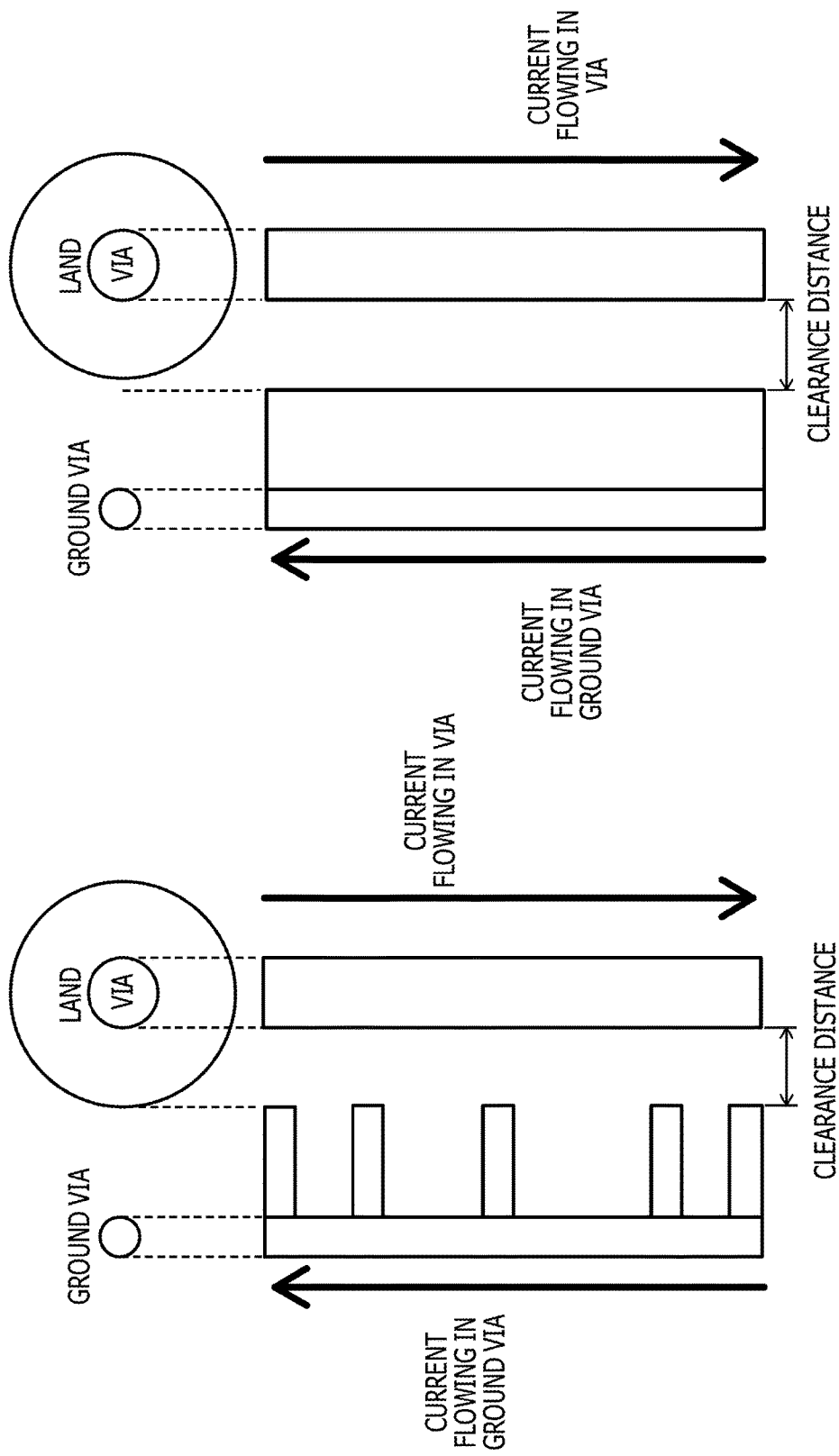
FIG. 4A and FIG. 4B illustrate one example of electromagnetic field analyses of a state in which a current flows between a via and a ground via adjacent to the via.

FIG. 4A and FIG. 4B illustrate one example of electromagnetic field analyses of a state in which a current flows between a via and a ground via adjacent to the via. FIG. 4A illustrates a three-dimensional electromagnetic field analysis and FIG. 4B illustrates a 2.5-dimensional electromagnetic field analysis.

The via may be an electrically-conductive member that penetrates from the front surface to the back surface of a board obtained by multilayer wiring of a signal layer, a power supply layer, and a ground layer or that penetrates between partial layers and does not completely penetrate the board. Lands for bonding solder are formed around the via on the front surface and back surface of the board. The ground via may be an electrically-conductive member that penetrates from the front surface to the back surface of the board or that penetrates between partial layers and does not completely penetrate the board similarly to the via. The ground via is coupled to a ground conductor formed in the ground layer. The space between the ground conductor and the via may be referred to as the clearance and the distance between the ground conductor and the via may be referred to as the clearance distance. The distance between the via and the ground via may be referred to as the ground via distance.

As illustrated in FIG. 4A, in the three-dimensional electromagnetic field analysis, the shape of the ground conductor disposed in the ground layer is reflected and the capacitance component and the inductance component of the conductor are calculated from the charge distributed on the surface of the sectional shape of the conductor and a voltage given to the conductor surface.

As illustrated in FIG. 4B, in the 2.5-dimensional electromagnetic field analysis, characteristics in the longitudinal direction of the conductor, for example, the direction in which the current flows, are deemed to be uniform and the capacitance component and the inductance component of the conductor are calculated from the charge distributed on the surface of the sectional shape of the conductor and a voltage given to the conductor surface.

In the 2.5-dimensional electromagnetic field analysis, the capacitance component and the inductance component of the conductor are calculated with characteristics in the direction in which the current flows deemed to be uniform. Therefore, the analysis might be carried out at higher speed than the three-dimensional electromagnetic field analysis. For example, in the 2.5-dimensional electromagnetic field analysis, the path through which a current actually flows in the ground via might differ from the path through which a current flows in the ground via in the analysis because characteristics in the direction in which the current flows are deemed to be uniform.

Figure 5:
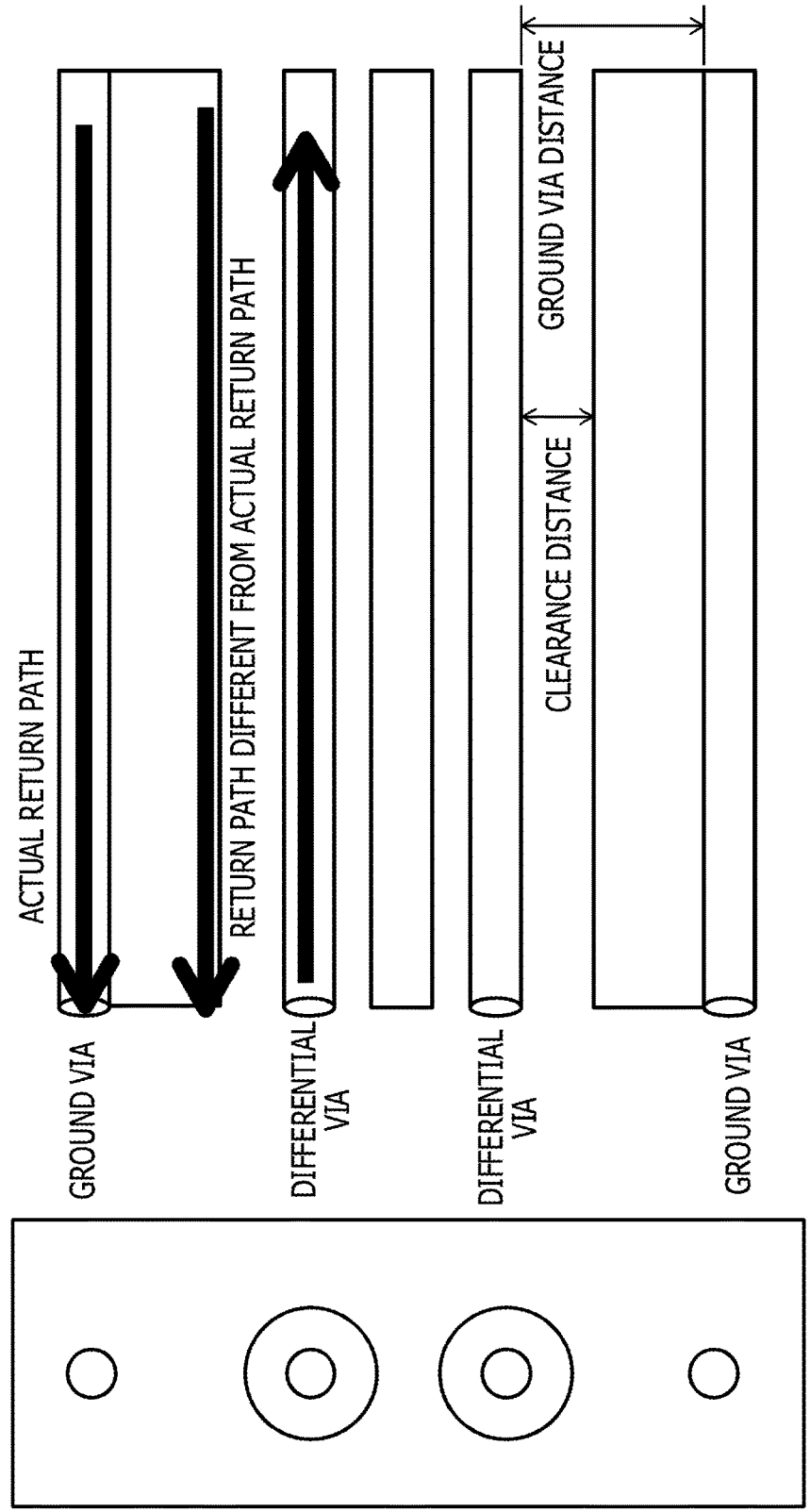
FIG. 5 illustrates one example of modeling of vias with use of a 2.5-dimensional electromagnetic field analysis.

FIG. 5 illustrates one example of modeling of vias with use of a 2.5-dimensional electromagnetic field analysis. In FIG. 5, a differential via is a via incorporated into a transmission line that transmits a signal and a current according to transmission of a signal flows in the differential via. A ground via is a via in which a return current of the current that flows in the differential via flows.

In the 2.5-dimensional electromagnetic field analysis, because characteristics in the direction in which the current flows are deemed to be uniform, the return path of the return current that flows in the ground via is the tip part of the ground conductor formed in the ground layer, and the distance between the return path and the via is the clearance distance. However, the actual return path is the ground via and therefore the distance between the actual return path and the via is the ground via distance, which is the distance between the ground via and the via. In the 2.5-dimensional electromagnetic field analysis, the distance between the return path and the via is the clearance distance shorter than the ground via distance as the actual distance. Thus, the extraction accuracy of the reactance component of the via becomes worse. Regarding the capacitance component of the via, coupling of the ground conductor, whose distance from the via is the clearance distance, is strong and the influence of the ground via hardly affects the calculation of the capacitance component of the via.

Figure 6:
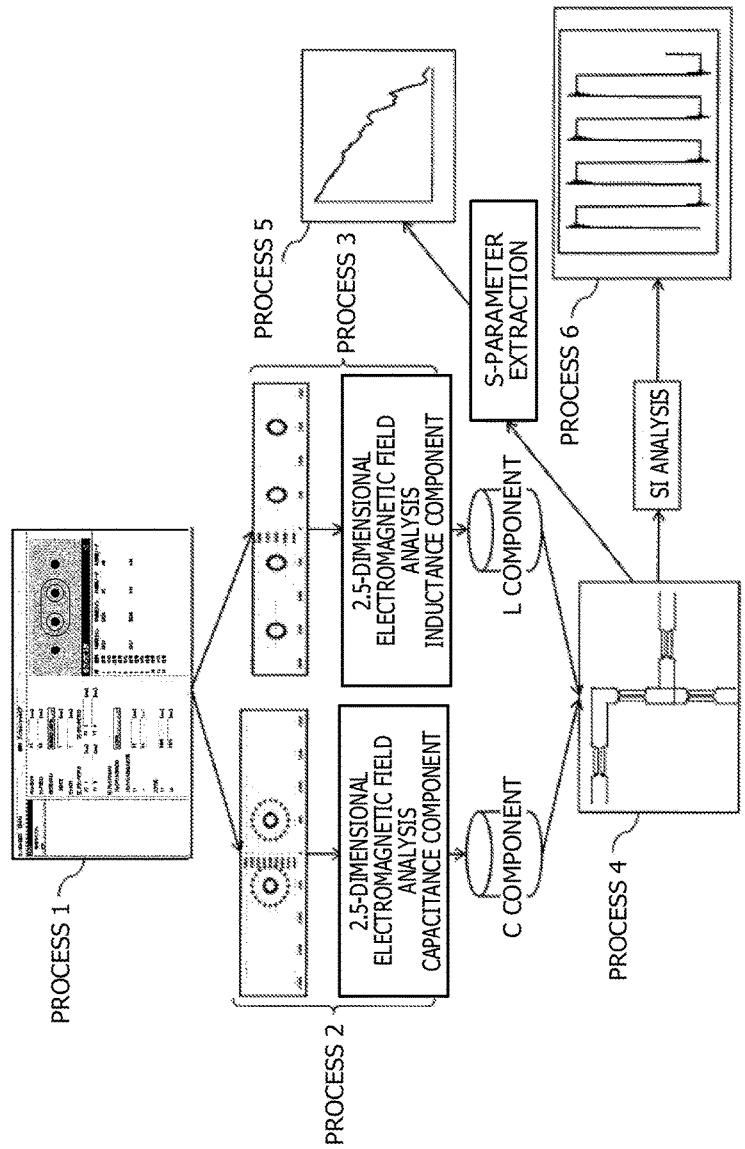
FIG. 6 illustrates one example of processes of via model generation.

FIG. 6 illustrates one example of processes of via model generation. In FIG. 6, a pair of vias to which a differential signal is input and a pair of ground vias disposed outside the pair of vias separately are disposed.

An information processing device acquires via arrangement information including the layer configuration including the layer thickness and the relative dielectric constant, the hole diameter of the vias, the shape and size of the clearance, the positions of the ground vias, and so forth (PROCESS 1). In one example, the information processing device acquires the via arrangement information through a GUI according to an input by an operator. In another example, the information processing device acquires the via arrangement information from CAD data and a layer configuration library stored in a storing unit. The information processing device may acquire the hole diameter of the vias, the shape and size of the clearance, the positions of the ground vias, and so forth through a GUI according to an input by an operator and acquire the layer configuration including the layer thickness and the relative dielectric constant from the layer configuration library. The information processing device calculates the capacitance component of the vias by a first 2.5-dimensional electromagnetic field analysis with use of the hole diameter of the vias, the shape and size of the clearance, and the relative dielectric constant of the board (PROCESS 2). The information processing device calculates the inductance component of the vias by a second 2.5-dimensional electromagnetic field analysis with use of the hole diameter of the vias, the ground via distance calculated from the positions of the ground vias, and the relative dielectric constant of the board (PROCESS 3).

The information processing device models the pair of vias based on the capacitance component calculated by the first 2.5-dimensional electromagnetic field analysis and the inductance component calculated by the second 2.5-dimensional electromagnetic field analysis, and generates via models (PROCESS 4). In one example, the via models are generated as the 5-parameter. In another example, the via models are generated by allocating the capacitance component and the inductance component to symbols of the transmission line as a W-element on which a simulation by HSPICE is possible. In one example, the information processing device outputs the via models generated by PROCESS 4 (PROCESS 5). In another example, the information processing device carries out an SI analysis of a signal transmitted through the transmission line including the vias by using the via models generated in PROCESS 4 (PROCESS 6).

In the above-described via model generation program, the creation time of the 2.5-dimensional model by PROCESS 1 to PROCESS 4 is approximately one minute and therefore the via models such as the S-parameter might be immediately generated. In the above-described via model generation program, the turnaround time of the SI analysis might become as short as approximately several minutes because of immediate generation of the via models such as the S-parameter. In the above-described via model generation program, modeling may be carried out in such a manner that vias are deemed as a lossy transmission line model that depends on the frequency.

Figure 7:
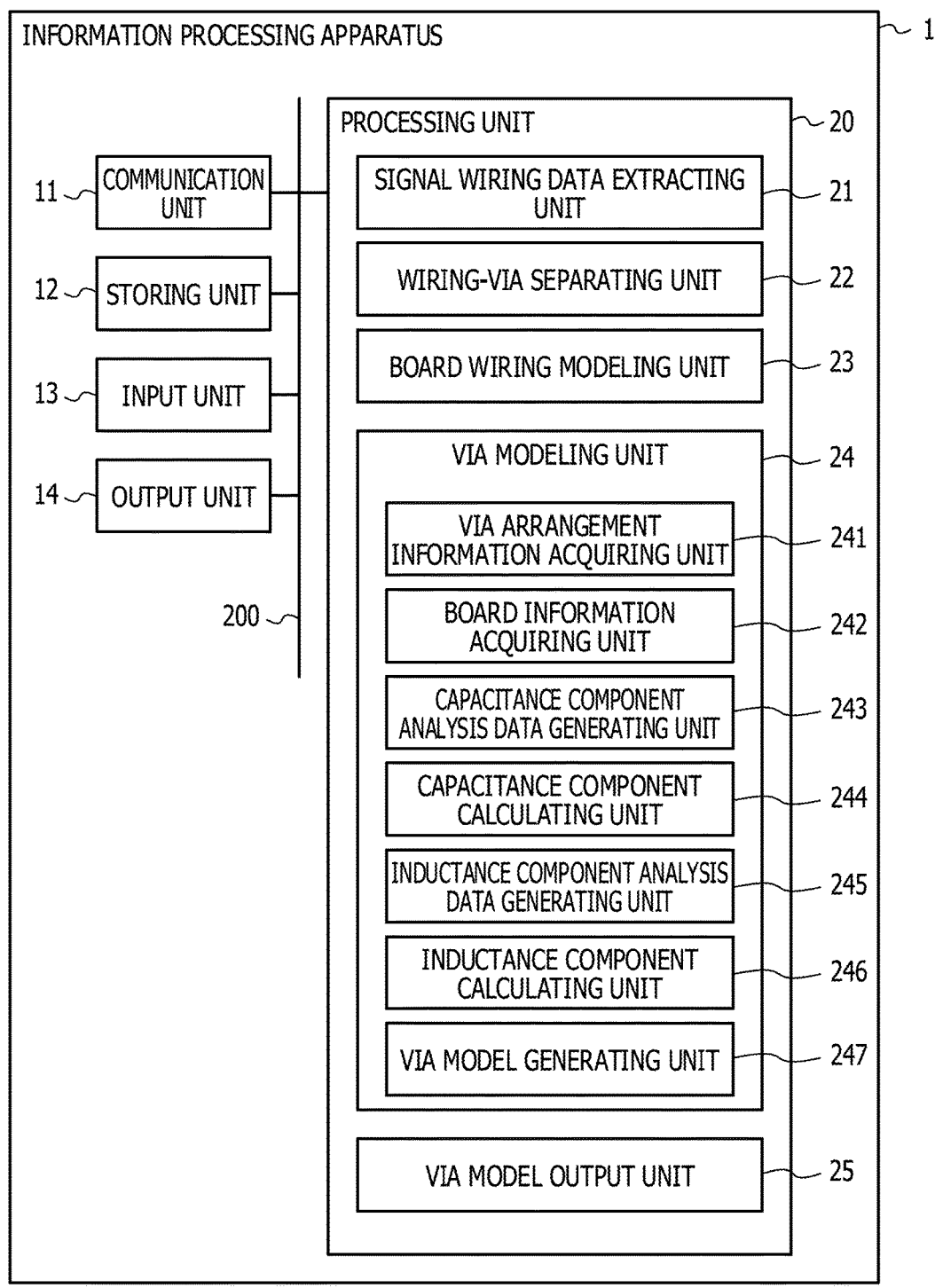
FIG. 7 illustrates one example of an information processing device.

FIG. 7 illustrates one example of an information processing device.

An information processing device 1 includes a communication unit 11, a storing unit 12, an input unit 13, an output unit 14, and a processing unit 20. The communication unit 11, the storing unit 12, the input unit 13, the output unit 14, and the processing unit 20 are coupled to each other through a bus 200. The information processing device 1 executes the via model generation program that calculates the capacitance component of a via by a 2.5-dimensional electromagnetic field analysis with use of the clearance distance between the via and a ground conductor and calculates the inductance component of the via with use of the distance between the via and a ground via.

The communication unit 11 includes a wired communication interface circuit of the Ethernet (registered trademark) or the like. The communication unit 11 communicates with another information processing device through a local area network (LAN), which is not diagrammatically represented.

The storing unit 12 includes at least one of a semiconductor storing device, a magnetic tape device, a magnetic disc device, and an optical disc device, for example. The storing unit 12 stores an operating system program, a driver program, an application program, data, or the like used for processing in the processing unit 20. For example, the storing unit 12 stores the via model generation program or the like as the application program. The via model generation program may be installed on the storing unit 12 from a computer-readable portable recording medium such as a compact disc read-only memory (CD-ROM) or a digital versatile disc read-only memory (DVD-ROM) by using a publicly-known setup program or the like.

The storing unit 12 stores various kinds of data used in processing executed by using the via model generation program. For example, the storing unit 12 stores the hole diameter of a via, the clearance diameter, the land diameter, the distance between a POS via and a NEG via that form differential vias, the position of a ground via when the center of the via is deemed as the base point, and so forth. The storing unit 12 may temporarily store temporary data relating to given processing.

The input unit 13 may be any device as long as input of data is possible and may be a touch panel, a keyboard, or the like, for example. An operator inputs characters, numbers, symbols, and so forth by using the input unit 13. When being operated by the operator, the input unit 13 generates a signal corresponding to the operation. The generated signal is supplied to the processing unit 20 as an instruction by the operator.

The output unit 14 may be any device as long as display of video, image, and so forth is possible and may be a liquid crystal display, an organic electro-luminescence (EL) display, or the like, for example. The output unit 14 displays video according to video data supplied from the processing unit 20, an image according to image data, and so forth. The output unit 14 may be an output device that prints video, image, characters, or the like on a display medium such as paper.

The processing unit 20 includes one or plural processors and a peripheral circuit thereof. The processing unit 20 controls overall operation of the information processing device 1 in an across-the-board manner and may be a central processing unit (CPU), for example. The processing unit 20 executes processing based on a program stored in the storing unit 12, e.g. a driver program, an operating system program, an application program, or the like. The processing unit 20 may execute plural programs, e.g. application programs or the like, in parallel.

The processing unit 20 includes a signal wiring data extracting unit 21, a wiring-via separating unit 22, a board wiring modeling unit 23, a via modeling unit 24, and a via model output unit 25. The via modeling unit 24 includes a via arrangement information acquiring unit 241, a board information acquiring unit 242, a capacitance component analysis data generating unit 243, and a capacitance component calculating unit 244. The via modeling unit 24 further includes an inductance component analysis data generating unit 245, an inductance component calculating unit 246, and a via model generating unit 247. These respective units may be functional modules implemented by a program executed by the processor included in the processing unit 20. For example, these respective units may be implemented in the information processing device 1 as firmware.

Figure 8:
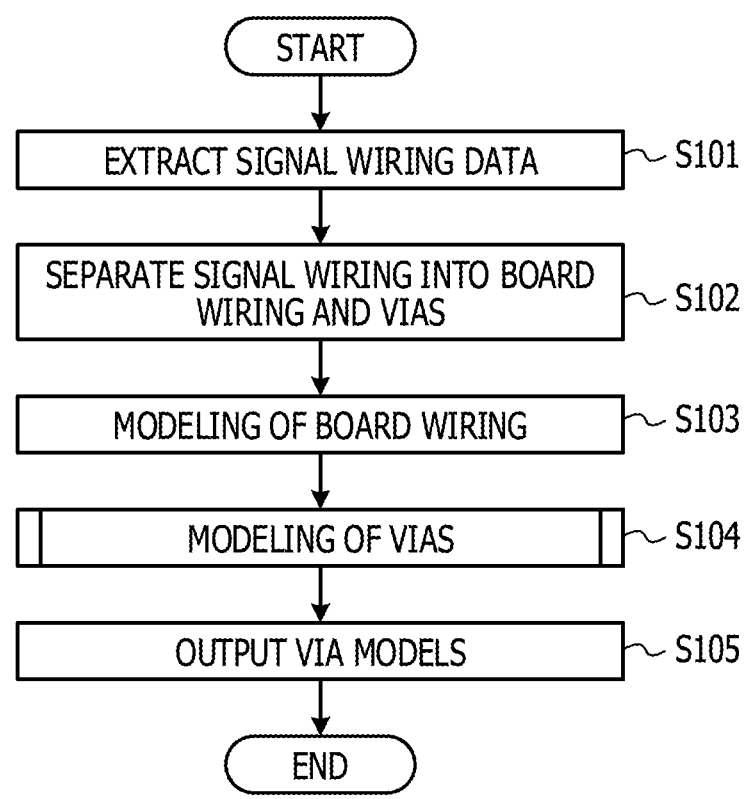
FIG. 8 illustrates one example of via model generation processing.

FIG. 8 illustrates one example of via model generation processing. The via model generation processing illustrated in FIG. 8 may be executed by the information processing device 1 illustrated in FIG. 7. The via model generation processing illustrated in FIG. 8 is executed mainly by the processing unit 20 in cooperation with the respective elements of the information processing device 1 based on the program stored in the storing unit 12 in advance.

The signal wiring data extracting unit 21 extracts signal wiring data (S101). If via models generated by the via model generation processing are used in a pre-layout simulation, the signal wiring data may be extracted from information input by an operator through a GUI. If the generated via models are used in a post-layout simulation, the signal wiring data may be extracted from CAD data that represents layout information including the wiring width and wiring pitch of the board wiring and arranged wiring information on the shape of vias and so forth. The wiring-via separating unit 22 separates the signal wiring corresponding to the signal wiring data extracted in the processing of S101 into board wiring and vias (S102). The board wiring modeling unit 23 models each wiring line in the board wiring separated in the processing of S102 as a capacitance component and an inductance component (S103). In one example, the board wiring modeling unit 23 models the board wiring as the capacitance component and the inductance component by a 2.5-dimensional electromagnetic field analysis or a three-dimensional electromagnetic field analysis. The board wiring modeling unit 23 may generate an S-parameter from the capacitance component and the inductance component of the modeled board wiring or allocate the modeled capacitance component and inductance component to symbols of the transmission line as a W-element. The via modeling unit 24 models each of the vias separated in the processing of S102 as a capacitance component and an inductance component and generates via models (S104). The via modeling unit 24 generates the via model that represents the modeled capacitance component and inductance component. The via modeling unit 24 may generate an S-parameter from the capacitance component and the inductance component of the modeled via or allocate the modeled capacitance component and inductance component to symbols of the transmission line as a W-element. The via model output unit 25 outputs the via models generated in the processing of S104 (S105).

Figures 9A, 9B:
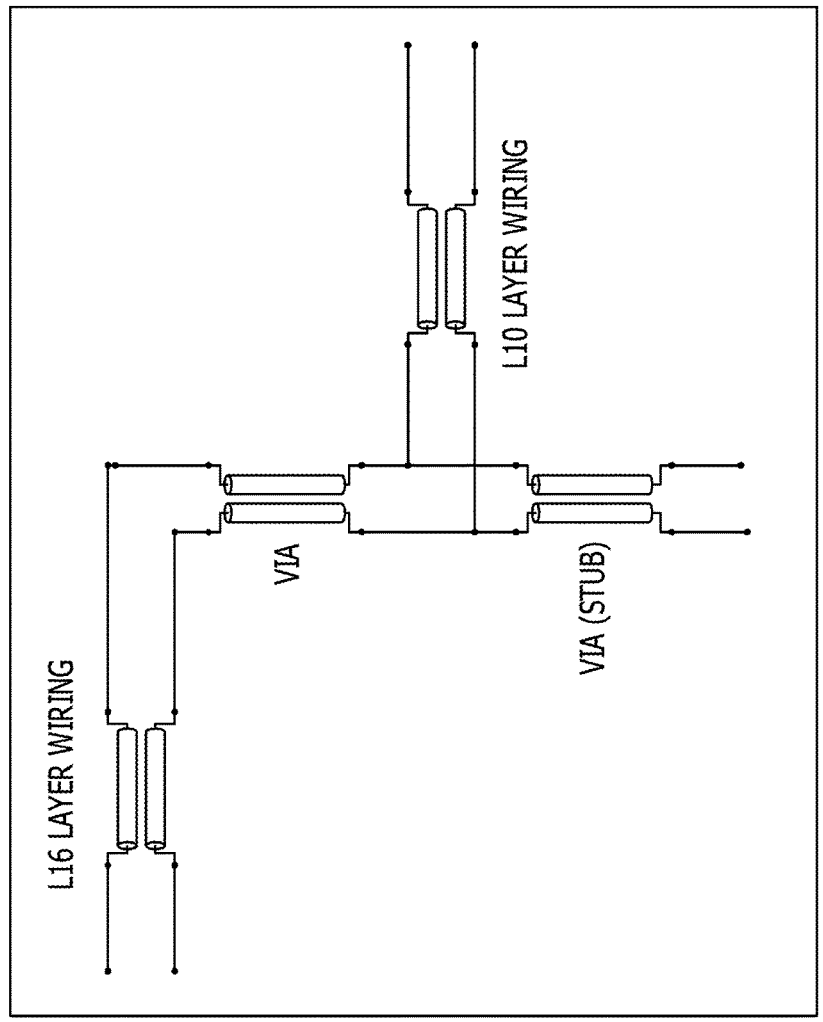
FIG. 9A illustrates one example of a CAD image.
FIG. 9B illustrates one example of a transmission line obtained by modeling CAD data that represents a CAD image.

FIG. 9A illustrates one example of a CAD image. In FIG. 9A, a CAD image corresponding to CAD data from which signal wiring data is extracted in the processing of S101 is illustrated. FIG. 9B illustrates one example of a transmission line obtained by modeling the CAD data that represents the CAD image.

In FIGS. 9A and 9B, the board is composed of 16 layers and coupling is established from 16-layer wiring to 10-layer wiring through differential vias. Vias under the 10-layer wiring are stubs.

Figure 10:
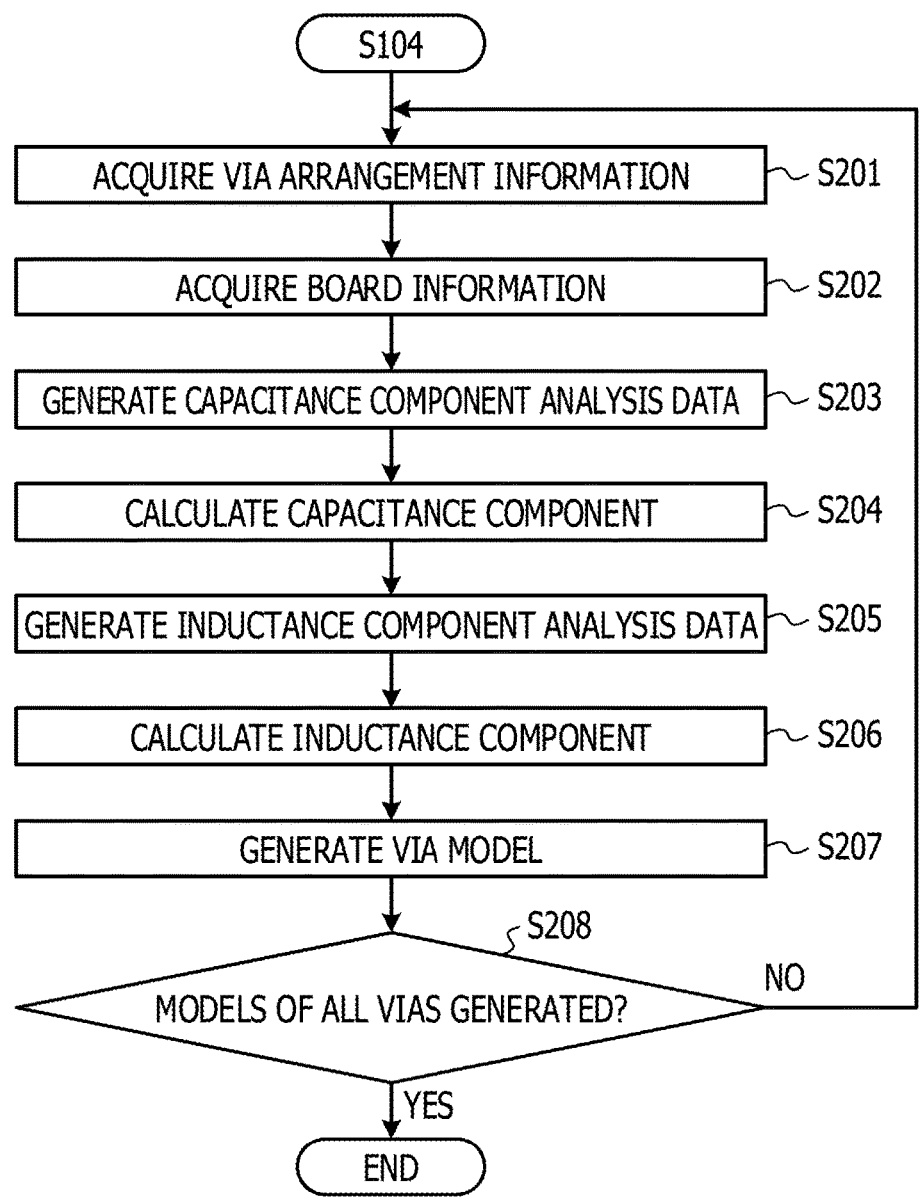
FIG. 10 illustrates one example of processing of S104.

FIG. 10 illustrates one example of the processing of S104.

The via arrangement information acquiring unit 241 acquires via arrangement information (S201). The via arrangement information includes the hole diameter of a via formed in the board, the clearance distance between a ground conductor formed in any of plural wiring layers and the differential via that transmits a signal, and the ground via distance between the via and a ground via formed in the ground conductor. The via arrangement information includes the land diameter of the differential via and the distance between a POS via and a NEG via that form the differential vias. The via arrangement information may be acquired from CAD data including arranged wiring information like that illustrated in FIG. 9A or be acquired from information input to a GUI by an operator. The via arrangement information acquiring unit 241 stores the acquired via arrangement information in a via information table stored in the storing unit 12.

The board information acquiring unit 242 acquires board information (S202). The board information includes the layer thickness of the board and the relative dielectric constant of the board material that is a dielectric. The board information may be acquired from a layer configuration library stored in the storing unit 12 or be acquired from information input to a GUI by an operator. The board information acquiring unit 242 stores the acquired board information in a board information table stored in the storing unit 12.

The capacitance component analysis data generating unit 243 generates capacitance component analysis data including the hole diameter of the via, the clearance distance, and the relative dielectric constant of the board (S203). The capacitance component analysis data generating unit 243 acquires the hole diameter of the via and the clearance distance from the via information table stored in the storing unit 12 and acquires the relative dielectric constant of the board from the board information table stored in the storing unit 12. The capacitance component calculating unit 244 calculates the capacitance component of the via by a first 2.5-dimensional electromagnetic field analysis with use of the capacitance component analysis data generated in the processing of S203 (S204).

Figure 11:
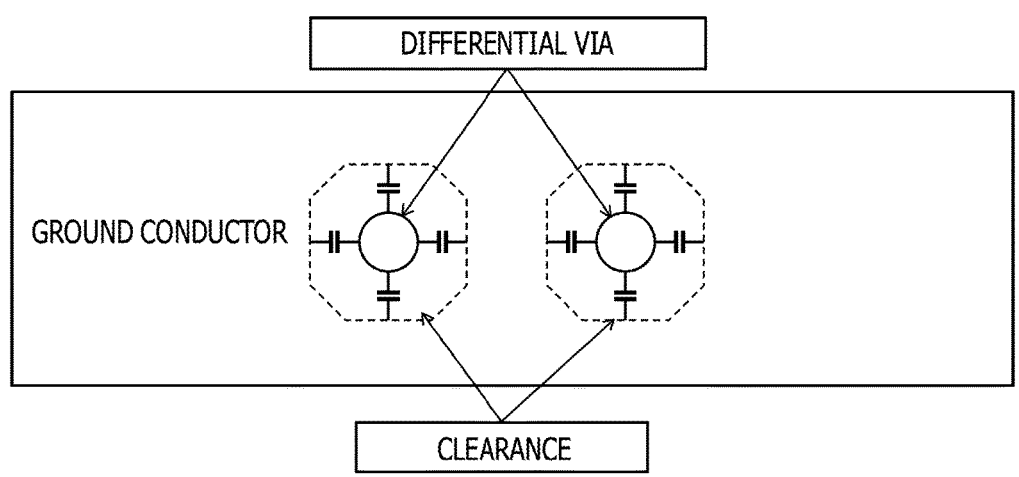
FIG. 11 illustrates one example of processing of S204.

FIG. 11 illustrates one example of the processing of S204.

In FIG. 11, the sectional shape of the clearance is a circular shape. Thus, the capacitance component analysis data generating unit 243 approximates the structure of the via to a coaxial structure and calculates the capacitance component of the via. Although the sectional shape of the clearance is a circular shape in FIG. 11, the sectional shape of the clearance may be another shape such as a rectangular shape. In FIG. 11, the clearance is formed corresponding to each of the POS via and the NEG via. However, the clearance may be formed to include both the POS via and the NEG via.

The inductance component analysis data generating unit 245 generates inductance component analysis data including the hole diameter of the via, the ground via distance, and the relative dielectric constant of the board (S205). The inductance component analysis data generating unit 245 acquires the hole diameter of the via and the ground via distance from the via information table stored in the storing unit 12 and acquires the relative dielectric constant of the board from the board information table stored in the storing unit 12. The inductance component calculating unit 246 calculates the inductance component of the via by a second 2.5-dimensional electromagnetic field analysis with use of the inductance component analysis data generated in the processing of S205 (S206).

Figure 12:
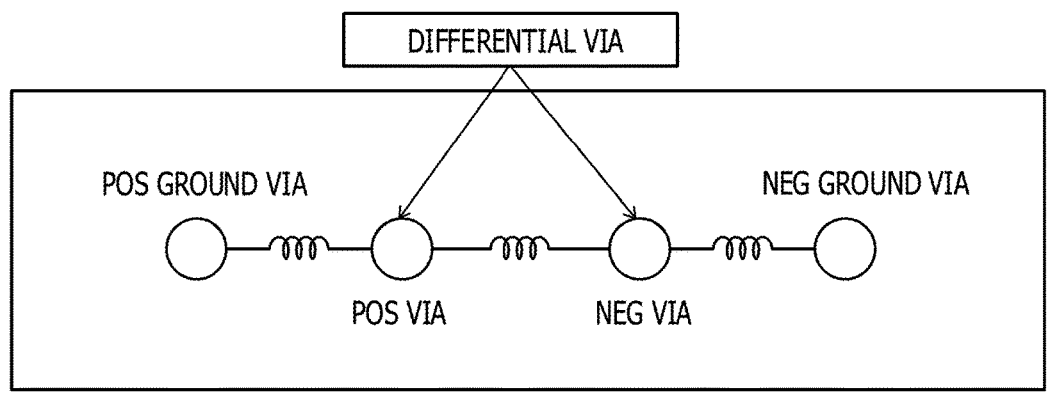
FIG. 12 illustrates one example of processing of S206.

FIG. 12 illustrates one example of the processing of S206.

In FIG. 12, regarding the POS via, the inductance component between the POS via and the POS ground via and between the POS via and the NEG via is calculated. Regarding the NEG via, the inductance component between the NEG via and the NEG ground via and between the NEG via and the POS via is calculated.

The via model generating unit 247 models the via based on the capacitance component calculated in S204 and the inductance component calculated in S206 and generates a via model (S207). The via model generating unit 247 generates the via model by acquiring the capacitance component calculated in S204, the inductance component calculated in S206, and the layer thickness of the board from the board information table stored in the storing unit 12.

The via arrangement information acquiring unit 241 determines whether or not all vias separated in S102 have been modeled (S208). When determining that all vias separated in the processing of S102 have not been modeled (S208—NO), the via arrangement information acquiring unit 241 acquires the via arrangement information of the next via (S201). From then on, S201 to S208 may be repeated until the via arrangement information acquiring unit 241 determines that all vias separated in S102 have been modeled (S208—YES).

Figure 13:
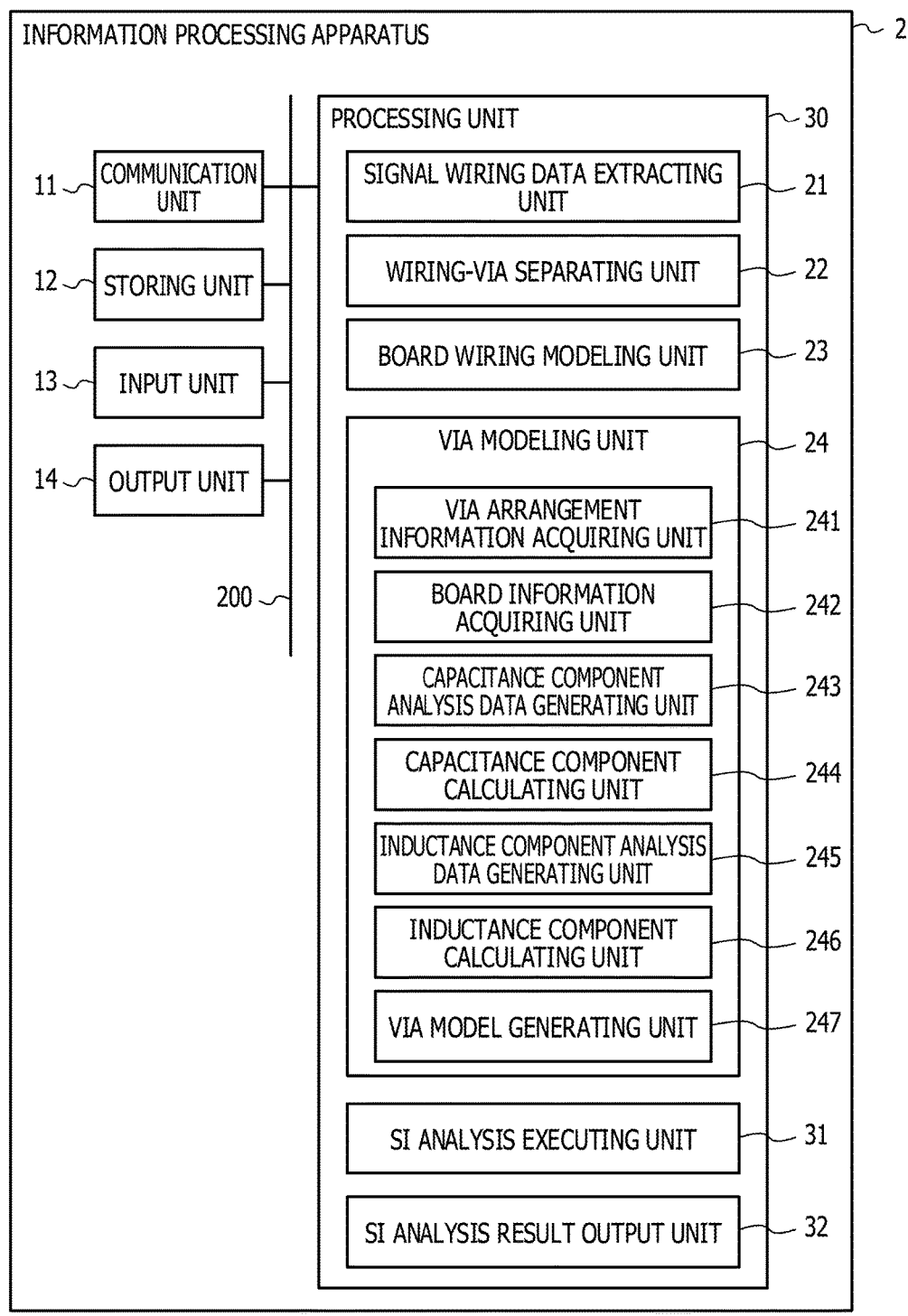
FIG. 13 illustrates one example of an information processing device.

FIG. 13 illustrates one example of an information processing device.

An information processing device 2 is different from the information processing device 1 in that the information processing device 2 includes a processing unit 30 instead of the processing unit 20. The processing unit 30 is different from the processing unit 20 in that the processing unit 30 includes an SI analysis executing unit 31 and an SI analysis result output unit 32 instead of the via model output unit 25. In FIG. 13, the configurations and functions of the constituent elements in the information processing device 2 except the SI analysis executing unit 31 and the SI analysis result output unit 32 may be substantially the same as or similar to the configurations and functions of the constituent elements given the same numerals in the information processing device 1 illustrated in FIG. 7, and detailed description thereof might be omitted.

Figure 14:
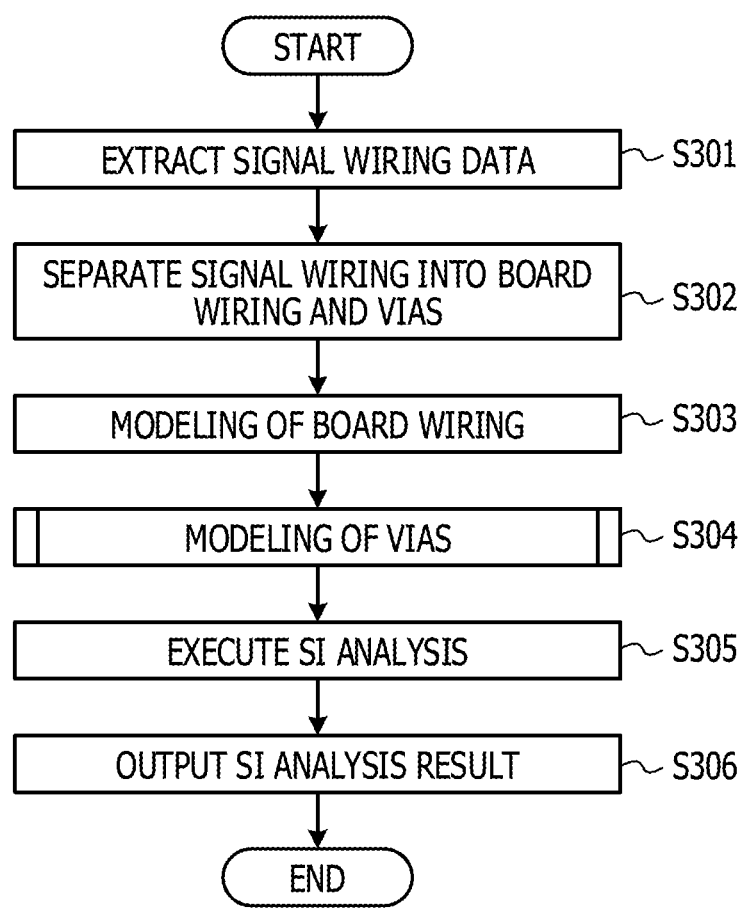
FIG. 14 illustrates one example of via model generation processing.

FIG. 14 illustrates one example of via model generation processing. The via model generation processing illustrated in FIG. 14 may be executed by the information processing device 2 illustrated in FIG. 13. The via model generation processing illustrated in FIG. 14 is executed mainly by the processing unit 30 in cooperation with the respective elements of the information processing device 2 based on a program stored in the storing unit 12 in advance. In the via model generation processing illustrated in FIG. 14, instead of outputting via models, an SI analysis is executed by using generated via models and the analysis result of the executed SI analysis is output. This is different from the via model generation processing illustrated in FIG. 8.

Processing of S301 to S304 may be the similar to the processing of S101 to S104 and detailed description thereof might be omitted. The SI analysis executing unit 31 executes an SI analysis of a signal transmitted through the transmission line including board wiring modeled in S303 and via models generated in S304 (S305). The SI analysis result output unit 32 outputs the analysis result of the SI analysis executed in the processing of S305 (S306). FIG. 15 illustrates one example of comparison between characteristics of modeling with use of a three-dimensional electromagnetic field analysis and characteristics of modeling with use of a 2.5-dimensional electromagnetic field analysis.

The above-described information processing device uses the 2.5-dimensional electromagnetic field analysis in the modeling of vias and therefore might provide a high-accuracy model that may be used in an SI analysis of high-speed transmission at 10 Gbps similarly to modeling with use of the three-dimensional electromagnetic field analysis.

The above-described information processing device models vias by the 2.5-dimensional electromagnetic field analysis in the modeling of the vias and therefore the vias may be modeled in a shorter time than in modeling the vias by the three-dimensional electromagnetic field analysis. For example, in the above-described modeling of vias, 2.5-dimensional models might be generated in approximately one minute whereas it takes three to five hours to generate three-dimensional models in the three-dimensional electromagnetic field analysis. In the above-described modeling of vias, the analysis time for the modeling might be approximately five minutes whereas the analysis time is approximately ten hours in the three-dimensional electromagnetic field analysis. As one example, as the time it takes to carry out via place modeling of one board, it takes at most 260 hours to model vias in the three-dimensional electromagnetic field analysis if ten high-speed transmission patterns (two kinds of vias×10) exist. In the modeling by the above-described information processing device, the time of the modeling only corresponds to the time of information input by a GUI or information extraction from CAD data and therefore the modeling of vias might be carried out in several minutes.

In the above-described modeling of vias, the distance between the via and a ground via is used for calculation of the inductance component of the via. Thus, the occurrence of a large calculation error of the inductance component due to the influence of the clearance might be reduced.

In FIG. 12, a single ground via is associated with each of the POS via and the NEG via as differential vias. For example, plural ground vias may be associated with each of the POS via and the NEG via as differential vias. Due to the associating of plural ground vias with each of the POS via and the NEG via as differential vias, the vias might be modeled with higher accuracy.

The information processing device 1 may be used for an SI analysis and be used for other transmission line analyses such as a power integrity (PI) analysis and an electromagnetic interference (EMI) analysis.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A via model generation method comprising:
   acquiring via arrangement information including a hole diameter of a via formed in a board including a plurality of wiring layers, a clearance distance between a ground conductor formed in one wiring layer of the plurality of wiring layers and the via, and a ground via distance between the via and a ground via coupled to the ground conductor;
   acquiring, by a computer, board information including a relative dielectric constant of the board;
   calculating a capacitance component of the via by a first 2.5-dimensional electromagnetic field analysis in which a shape of a target of electromagnetic field analysis is planarly modeled with use of the hole diameter of the via, the clearance distance, and the relative dielectric constant of the board;
   calculating an inductance component of the via by a second 2.5-dimensional electromagnetic field analysis in which a shape of a target of electromagnetic field analysis is planarly modeled with use of the hole diameter of the via, the ground via distance, and the relative dielectric constant of the board; and
   generating a via model including the capacitance component and the inductance component.

2. The via model generation method according to claim 1, wherein in the first 2.5-dimensional electromagnetic field analysis and the second 2.5-dimensional electromagnetic field analysis, characteristics in a direction in which a current flows in a conductor of the target of electromagnetic field analysis are deemed to be uniform and the capacitance component and the inductance component of the conductor are calculated from a charge distributed on a surface of a sectional shape of the conductor and a voltage of a conductor surface, respectively.

3. The via model generation method according to claim 1, further comprising outputting the generated via model.

4. The via model generation method according to claim 1, wherein the generated via model includes an S-parameter.

5. The via model generation method according to claim 1, further comprising analyzing a signal transmitted through a transmission line including the via by using the via model.

6. The via model generation method according to claim 1, wherein the via arrangement information further includes a distance between a pair of vias that transmit a differential signal, and the distance between the pair of vias is used when the inductance component of one via of the pair of vias is calculated.

7. The via model generation method according to claim 1, wherein the ground via distance includes distances between the via and a plurality of ground vias, and the distances between the via and the plurality of ground vias are used when the inductance component of the via is calculated.

8. An information processing device comprising:
   a memory configured to store a via model generation program;
   a processor configured to preform, based on the via model generation program, operations of:
      acquiring via arrangement information including a hole diameter of a via formed in a board including a plurality of wiring layers, a clearance distance between a ground conductor formed in one wiring layer of the plurality of wiring layers and the via, and a ground via distance between the via and a ground via coupled to the ground conductor;
      acquiring board information including a relative dielectric constant of the board;
      calculating a capacitance component of the via by a first 2.5-dimensional electromagnetic field analysis in which a shape of a target of electromagnetic field analysis is planarly modeled with use of the hole diameter of the via, the clearance distance, and the relative dielectric constant of the board;
      calculating an inductance component of the via by a second 2.5-dimensional electromagnetic field analysis in which a shape of a target of electromagnetic field analysis is planarly modeled with use of the hole diameter of the via, the ground via distance, and the relative dielectric constant of the board; and
      generating a via model including the capacitance component and the inductance component.

9. The information processing device according to claim 8, wherein in the first 2.5-dimensional electromagnetic field analysis and the 2.5-dimensional second electromagnetic field analysis, characteristics in a direction in which a current flows in a conductor of the target of electromagnetic field analysis are deemed to be uniform and the capacitance component and the inductance component of the conductor are calculated from a charge distributed on a surface of a sectional shape of the conductor and a voltage of a conductor surface, respectively.

10. The information processing device according to claim 8, wherein the processor outputs the generated via model.

11. The information processing device according to claim 8, wherein the generated via model includes an S-parameter.

12. The information processing device according to claim 8, wherein the processor analyzes a signal transmitted through a transmission line including the via by using the via model.

13. The information processing device according to claim 8, wherein the via arrangement information further includes a distance between a pair of vias that transmit a differential signal, and the distance between the pair of vias is used when the inductance component of one via of the pair of vias is calculated.

14. The information processing device according to claim 8, wherein the ground via distance includes distances between the via and a plurality of ground vias, and the distances between the via and the plurality of ground vias are used when the inductance component of the via is calculated.

15. A non-transitory computer-readable recording medium storing via model generation program which causes a computer operations, the operations comprising:
acquiring via arrangement information including a hole diameter of a via formed in a board including a plurality of wiring layers, a clearance distance between a ground conductor formed in one wiring layer of the plurality of wiring layers and the via, and a ground via distance between the via and a ground via coupled to the ground conductor;
acquiring board information including a relative dielectric constant of the board;
calculating a capacitance component of the via by a first 2.5-dimensional electromagnetic field analysis in which a shape of a target of electromagnetic field analysis is planarly modeled with use of the hole diameter of the via, the clearance distance, and the relative dielectric constant of the board;
calculating an inductance component of the via by a second 2.5-dimensional electromagnetic field analysis in which a shape of a target of electromagnetic field analysis is planarly modeled with use of the hole diameter of the via, the ground via distance, and the relative dielectric constant of the board; and
generating a via model including the capacitance component and the inductance component.

16. The non-transitory computer-readable recording medium according to claim 15, wherein in the first 2.5-dimensional electromagnetic field analysis and the 2.5-dimensional second electromagnetic field analysis, characteristics in a direction in which a current flows in a conductor of the target of electromagnetic field analysis are deemed to be uniform and the capacitance component and the inductance component of the conductor are calculated from a charge distributed on a surface of a sectional shape of the conductor and a voltage of a conductor surface, respectively.

17. The non-transitory computer-readable recording medium according to claim 15, further comprising outputting the generated via model.

18. The non-transitory computer-readable recording medium according to claim 15, wherein the generated via model includes an S-parameter.

19. The non-transitory computer-readable recording medium according to claim 18, further comprising analyzing a signal transmitted through a transmission line including the via by using the via model.

20. The non-transitory computer-readable recording medium according to claim 15, wherein the via arrangement information further includes a distance between a pair of vias that transmit a differential signal, and the distance between the pair of vias is used when the inductance component of one via of the pair of vias is calculated.

* * * * *